United States Patent [19]

Sugahara et al.

[11] Patent Number: 5,338,388
[45] Date of Patent: Aug. 16, 1994

[54] METHOD OF FORMING SINGLE-CRYSTAL SEMICONDUCTOR FILMS

[75] Inventors: Kazuyuki Sugahara; Takashi Ipposhi, both of Itami, Japan

[73] Assignee: Mitsubishi Denki Kabushiki Kaisha, Tokyo, Japan

[21] Appl. No.: 877,811

[22] Filed: May 4, 1992

[51] Int. Cl.$^5$ ................................................ C30B 23/02
[52] U.S. Cl. .................................... 117/44; 117/904
[58] Field of Search ............... 156/603, 620.7, 620.72, 156/620.73, DIG. 65, DIG. 73, DIG. 80, DIG. 105; 437/84, 89, 908, 943, 973

[56] References Cited

U.S. PATENT DOCUMENTS

| | | | |
|---|---|---|---|
| 3,585,088 | 6/1971 | Schwutte et al. | 156/603 |
| 4,323,417 | 4/1982 | Lam | 156/DIG. 105 |
| 4,375,993 | 3/1983 | Mori et al. | 148/DIG. 93 |
| 4,383,883 | 5/1983 | Mizutani | 156/603 |
| 4,581,520 | 4/1986 | Vu et al. | 219/349 |
| 4,760,036 | 7/1988 | Schubert | 437/90 |
| 4,822,752 | 4/1989 | Sugahara et al. | 437/174 |

FOREIGN PATENT DOCUMENTS

| | | |
|---|---|---|
| 0124261 | 11/1984 | European Pat. Off. |
| 0319082 | 6/1989 | |
| 2177256 | 1/1987 | United Kingdom |

OTHER PUBLICATIONS

J. Appl. Phys., vol. 62, No. 10, Nov. 15, 1987, pp. 4178–4181, K. Sugahara, et al., "Orientation Control of the Silicon Film on Insulator by Laser Recrystallization".
Mat. Res. Soc. Symp. Proc. 164, 1990, pp. 371–376, K. Sugahara, et al., "Crystal-Axis-Rotation of Laser-Recrystallized Silicon on Insulator" (Aug. 6, 1987).

*Primary Examiner*—R. Bruce Breneman
*Assistant Examiner*—Felisa Garrett
*Attorney, Agent, or Firm*—Oblon, Spivak, McClelland, Maier & Neustadt

[57] ABSTRACT

A method of forming single-crystal semiconductor films, in which a single-crystal semiconductor substrate having a crystal axis transferred from a single-crystal semiconductor substrate is formed on an insulator layer via a seed hole which goes through the insulator layer which is formed on the single-crystal semiconductor substrate, comprises the steps of: forming a non-single-crystal semiconductor substrate connected to a single-crystal semiconductor substrate via a seed hole on an insulator layer; irradiating a compound beam which includes a first energy beam having a power density which is capable of melting a non-single-crystal semiconductor film and a second energy beam having a power density which is not capable of melting the non-single-crystal semiconductor film but capable of softening the insulator layer positioned below the non-single-crystal semiconductor film; and epitaxially growing the single-crystal semiconductor film in such a way that the non-single-crystal semiconductor film is melted and then solidified again by scanning the surface of the non-single-crystal semiconductor film with the compound beam, starting from the seed hole, in such a manner that the first energy beam is irradiated first and the second energy beam is irradiated second.

8 Claims, 5 Drawing Sheets

METHOD OF FORMING SINGLE-CRYSTAL SEMICONDUCTOR FILMS

BACKGROUND OF THE INVENTION

1. Field of the Invention

The present invention relates to a method of forming single-crystal semiconductor films. More particularly, the present invention relates to a method of forming single-crystal semiconductor films on an insulator layer via a seed hole which goes through the insulator layer which is formed on a single-crystal semiconductor substrate.

2. Description of the Related Art

To enhance the performance of a semiconductor device, attempts have been made to manufacture a laminated semiconductor device by a method in which circuit elements are three-dimensionally laminated into a multilayered form. In such a method, a step is needed in which only non-single-crystal semiconductor layers are heated and melted, while a semiconductor substrate temperature is being kept at a relatively low temperature of 800° C. or lower, by irradiating an energy beam which is finely condensed onto a non-single-crystal semiconductor layer deposited on an insulator layer on a semiconductor substrate, the non-single-crystal semiconductor layer being transformed into a single crystal. The substrate temperature is kept at 800° C. or lower to prevent impurities in impurity portions of circuit elements formed in the substrate from being diffused to other portions.

Referring to FIGS. 5 and 6, a conventional method of forming single-crystal semiconductor films will now be explained. FIG. 6 is a cross-sectional view taken along line I'I in FIG. 5. A silicon oxide film 2 having a thickness of approximately 1 μm is formed on a silicon substrate 1. A seed hole 3 having a diameter of approximately 3 μm is so provided that it goes through the silicon oxide film 2. A polycrystalline silicon film 4 having a thickness of approximately 0.5 μm is deposited by a chemical vapor deposition (CVD) method on the silicon oxide film 2. A plurality of silicon nitride film patterns 5a and 5b, which are deposited to a thickness of approximately 500Å by the CVD process and patterned, are provided on the polycrystalline silicon film 4. The nitride film patterns 5a having a quadrilateral shape, one side of which has a length of approximately 4 μm, are provided above the seed hole 3. The nitride film was patterned into stripes with lines and spaces of 5 μm and 10 μm, respectively. A single-crystal silicon film is formed by melting the polycrystalline silicon film 4 in a direction along the nitride film patterns 5b by energy beam irradiation starting from the seed hole 3.

The step in which the polycrystalline film 4 is melted and transformed into a single crystal is shown in FIG. 7. The silicon substrate 1 is heated to approximately 450° C. by an unillustrated resistor heater. A laser beam 6, a cross section of which is condensed into the shape of a circle 6a having a diameter of approximately 100 μm, is scanned along the nitride film patterns 5b at a speed of 25 cm/s in a direction indicated by the arrow L, starting from the silicon nitride film pattern 5a formed above the seed hole 3. This laser beam 6 can be obtained by, for example, a continuous oscillation type argon laser having an output of 12 W.

The polycrystalline silicon film 4 melts in a portion 4a irradiated by the laser beam 6, and the silicon oxide film 2 is softened in a portion 2a directly below the portion 4a. The melted silicon solidifies again after the laser beam 6 has passed by it. As a result, a single-crystal silicon film 4b having a crystal axis transferred from the silicon substrate 1 through the seed hole 3 is epitaxially grown.

The nitride film patterns 5b shown in FIG. 5 function as films for preventing reflection of the laser beam 6 and control the distribution of temperatures in a direction traversing the direction in which single crystals are grown so that the single crystals are grown long from the seed hole 3. The silicon nitride film patterns 5a, having a quadrilateral shape, provided above the seed hole 3, are provided to prevent the laser beam 6 from reflecting and increase heat absorption, so that escape of heat, due to the silicon filled in the seed hole 3 having heat conductivity larger than that of the oxide film 2, is compensated for.

Such an above-described mechanism according to the prior art for forming silicon single-crystal films is described in detail in "Extended Abstract of the 18th (1986) International Conference on Solid State Devices and Materials, Tokyo, 1986, pp.565–568".

Single-crystal semiconductor films according to the prior art have been formed as described above. However, there is a problem in that, the crystal axis of the single-crystal silicon film 4b obtained in the above-described way, it is rotated continuously in proportion to the distance from the seed hole 3.

FIG. 8 is a graph, in which the angle between the crystal axis of the single-crystal silicon film 4b and the crystal axis of the silicon substrate 1 measured by electron channeling pattern (ECP) are shown with respect to the distance from the seed hole 3. The horizontal axis shows the distance (μm) from a seed and the vertical axis shows the crystal axis rotational angle (in degrees). The curve A indicated by white circular marks shows the rotational angle of the crystal axis of the single-crystal silicon film 4b obtained by the prior art. It can be seen from this curve A that the crystal axis is rotated as much as approximately 30 degrees at a distance of 300 μm from the seed hole 3. Such a phenomenon concerning the rotation of the crystal axis can be explained as described below.

FIG. 9 is a schematic sectional view in which the two-dimensional temperature distribution in the vicinity of the interface between, as shown in FIG. 7, the portion 4a where silicon is melted and the single-crystal silicon film 4b, indicated by an isothermal line determined by simulation. In this figure, the silicon melted band 4a progresses from left to right. An isothermal line MP indicated by a broken line in FIG. 9 indicates a temperature 1,414° C., which is the melting point of silicon. The solid-liquid interface between the silicon melted band 4a and the single-crystal silicon film 4b exists along this isothermal line MP. AS can be seen from the isothermal line MP, the solid-liquid interface is inclined backwards when it is considered that the silicon melted band 4a progresses in a forward direction. That is, in the vicinity of the solid-liquid interface, the temperature of the upper layer portion of the single-crystal silicon film 4b is higher than that of the lower layer portion thereof.

Therefore, the crystal lattices in the upper layer portion of the single-crystal silicon film 4b are more extended due to heat expansion than the crystal lattices in the lower layer portion. In such a condition, the silicon atoms in the silicon melted band 4a are epitaxially solidified again on the crystal lattices bent on the solid-liquid interface, and fixed to the silicon oxide film 2 of the lower layer in that condition. In this way, the crystal axis of the single-crystal silicon film 4b is gradually rotated as the growth thereof progresses.

SUMMARY OF THE INVENTION

The present invention has been accomplished in light of the above-mentioned problems of the prior art.

An object of the present invention is to provide a method of forming very high quality single-crystal semiconductor films whose crystal axes rotate just a few degrees on insulator layers.

The above object is achieved by the method of forming single-crystal semiconductor films in accordance with the present invention, in which a single-crystal semiconductor film having a crystal axis transferred from a single-crystal semiconductor substrate is formed on an insulator layer via a seed hole which goes through the insulator layer which is formed on the single-crystal semiconductor substrate, said method comprising the steps of:

forming a non-single-crystal semiconductor substrate connected to a single-crystal semiconductor substrate via a seed hole on an insulator layer;

irradiating a beam compounded of a first energy beam having a power density which is capable of melting a non-single-crystal semiconductor film and a second energy beam having a power density which is not capable of melting the non-single-crystal semiconductor film but capable of softening an insulator layer positioned below the non-single-crystal semiconductor film; and epitaxially growing the single-crystal semiconductor film in such a way that the non-single-crystal semiconductor film is melted and then solidified again by scanning the surface of the non-single-crystal semiconductor film with the compound beam, starting from the seed hole, in such a manner that the first energy beam is irradiated first and the second energy beam is irradiated second.

DESCRIPTION OF THE PREFERRED EMBODIMENT

A preferred embodiment of the present invention will be explained below with reference to the accompanying drawings.

Figure 1:
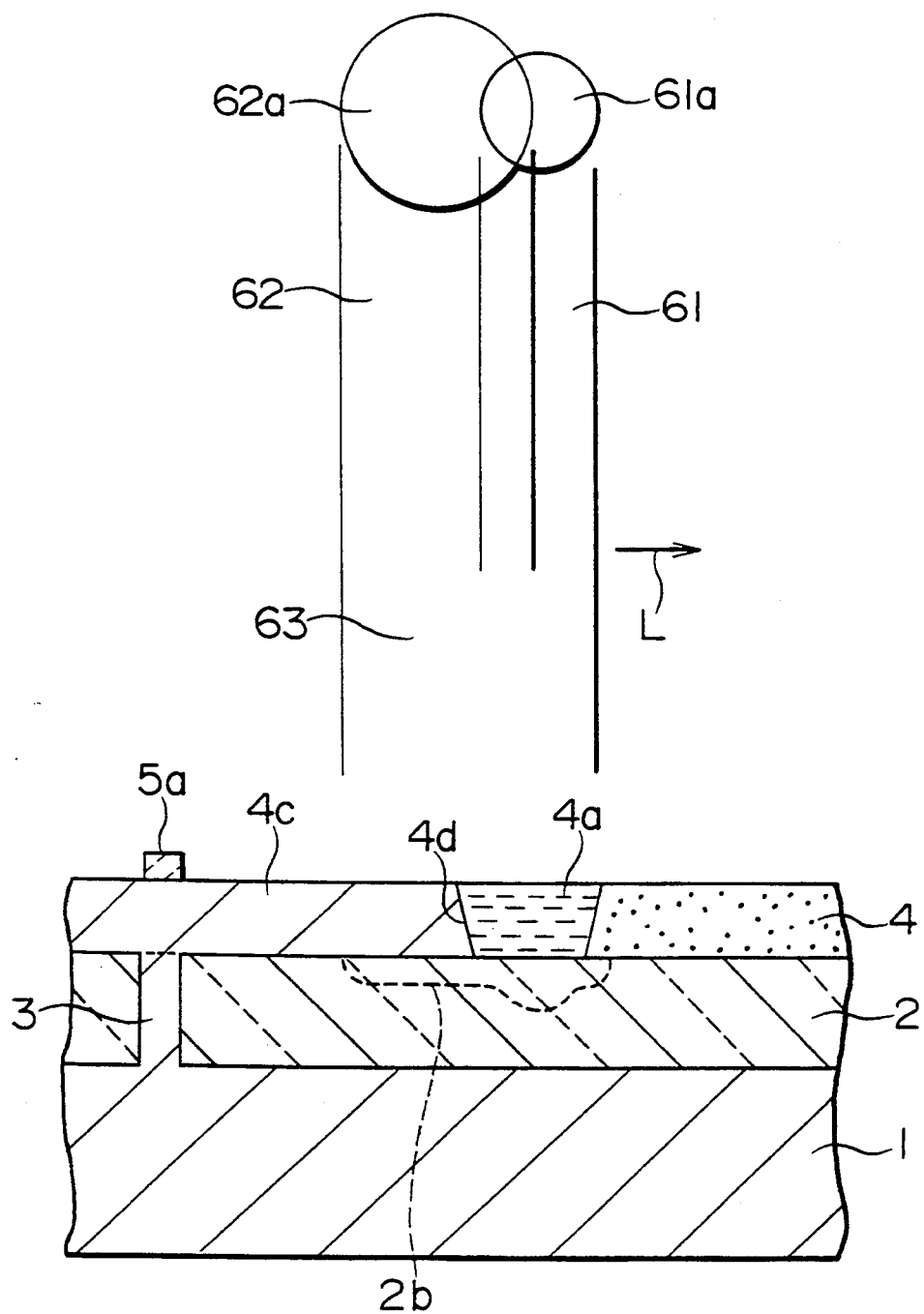
FIG. 1 is a view which illustrates a method of forming single-crystal semiconductor films according to an embodiment of the present invention.
Figure 5:
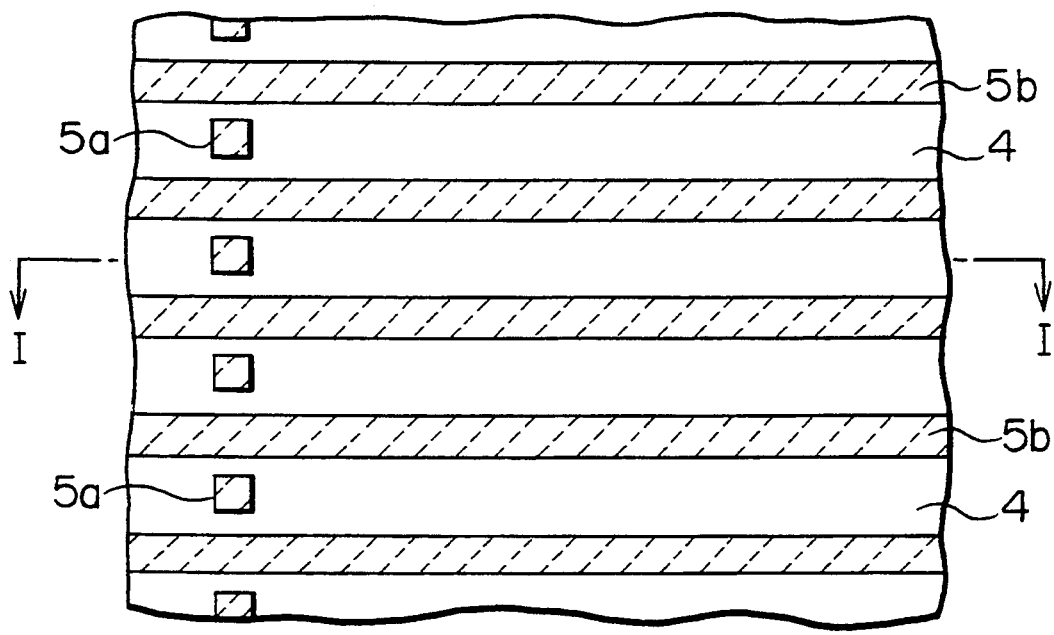
FIG. 5 is a plan view which illustrates the surface of a polycrystalline film formed on a substrate to form the single-crystal film.
Figure 6:
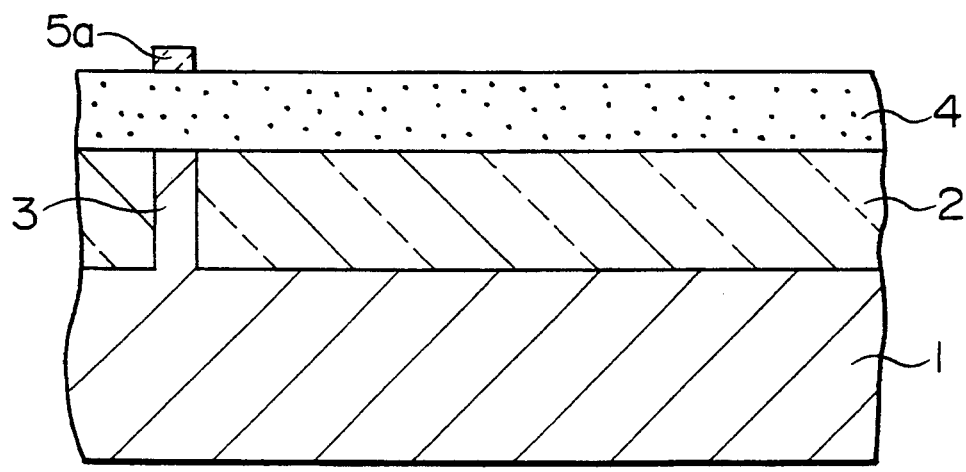
FIG. 6 is a cross-sectional view taken along line I—I in FIG. 5.

In FIG. 1, a silicon oxide film 2 having a thickness of approximately 1 μm is formed on a silicon single-crystal substrate 1. A seed hole 3 having a diameter of proximately 3 μm is so provided that it goes through the silicon oxide film 2. A polycrystalline silicon film 4 having a thickness of approximately 0.5 μm is deposited by a CVD process on the silicon oxide film 2. A plurality of silicon nitride film patterns 5a, one side of which has a length of approximately 4 μm, which are deposited to a thickness of approximately 500Å by the CVD process and patterned, are provided above the seed hole 3 on the polycrystalline silicon film 4. Although not shown in FIG. 1, the nitride film was patterned into stripes with lines and spaces of 5 μm and 10 μm, respectively, as shown in FIG. 5

A compound laser beam 63 is formed by compounding a part of a first laser beam 61 on a part of a second laser beam 62 each of which are obtained from an unillustrated argon laser of a wavelength 4,880Å and which have a Gauss type temperature distribution. The polycrystalline silicon film 4 is melted by scanning the surface of the polycrystalline silicon film 4 by using the compound laser beam 63 in the direction indicated by the arrow L, and is transformed into a single crystal.

The cross section of the first laser beam 61 is condensed into the shape of a circle 61a having a diameter of approximately 100 μm, and the first laser beam 61 has an output 12 W. In contrast, the cross section of the second beam 62 is condensed into the shape of a circle 62a having a diameter of approximately 150 μ, and the second laser beam 62 has an output 14 W. With the first and second laser beams 61 and 62 used as one compound laser beam 63 with their relative positions being fixed, such compound laser beam 63 is scanned on the polycrystalline silicon film 4. At this time, the compound laser beam 63 is scanned at a speed of 25 cm/s in the direction indicated by the arrow L starting at the silicon nitride film patterns 5a formed above the seed hole 3 in such a way that the first laser beam 61 is irradiated first and the second laser beam 62 is irradiated second. The silicon substrate 1 is heated to approximately 450° C. by an unillustrated resistor heater.

The first laser beam 61 which is irradiated first has a power density of 48 j/cm$^2$. This exceeds the power density 45 j/cm$^2$ required to melt the polycrystalline silicon film 4. In contrast, the second laser beam 62 has a power density of 37 j/cm$^2$. Although it cannot melt the polycrystalline silicon film 4, it can indirectly heat the silicon oxide film 2 under the polycrystalline silicon film 4 to 1,200° C., which is higher than 1,150° C., which is the softening point of the silicon oxide film 2.

As a consequence, the polycrystalline silicon film 4 melts only in the portion 4a irradiated by the first laser beam 61. The melted silicon solidifies again after the first laser beam 61 has passed by it. As a result, a polycrystalline silicon film 4c having a crystal axis transferred from the silicon substrate 1 via the seed hole 3 is epitaxially grown. However, when the melted silicon solidifies again, since it is irradiated by the second laser beam 62 following the first laser beam 61, the silicon oxide film 2 is softened in a portion directly under the portion where the silicon solidifies. A portion 2b indicated by a broken line within the silicon oxide film 2 in FIG. 1 indicates the portion having a temperature which is at or above the melting point 1,150° C. of the silicon oxide film 2. The silicon oxide film 2 is softened within the portion 2b. According to the simulation of temperature distribution, the back end portion of the portion 2b where the silicon oxide film 2 is softened extends from a solid-liquid interface 4d which lies in the extreme end at which the polycrystalline silicon film 4c is grown to a distance of 140 μm in the backward direction.

It was seen that when the rotation of the crystal axis of the single-crystal silicon film 4c formed as described above was measured by ECP, the rotation was less than one degree at a distance of 300 μm from the seed hole 3. The results of the measurement are shown by the curve B marked with triangular marks in FIG. 8. Such a small rotation of the crystal axis poses no problem from an industrial point of view when semiconductor circuit elements are formed on the silicon single-crystal film 4c. That is, it can be seen from the method in FIG. 1 that a silicon single-crystal film having a quality which is sufficiently satisfied from an industrial point of view can be formed on an insulator layer.

The reason why the rotation of the crystal axis of the silicon single-crystal film is small can be understood as follows: after the inventors of the present invention made an examination, it became evident that the silicon single-crystal film 4b having a crystal-axis rotation, formed by the prior art shown in FIG. 7 and indicated by the curve A in FIG. 8, scarcely contains any crystal defects. This fact indicates that the crystal-axis rotation is caused by the elastic deformation. As described above, the silicon single-crystal film 4b fixed to the silicon oxide film 2 while the crystal axis is being rotated is in a high free energy state having elastic strain energy. Therefore, as in the method shown in FIG. 1, if the upper layer portion 2b of the silicon oxide film 2 under the silicon single-crystal film 4c is softened, it is thought that the particles which form the oxide film 2 move so that the silicon single-crystal film 4c discharges the elastic strain energy, permitting the crystal-axis rotation to turn back.

Figure 7:
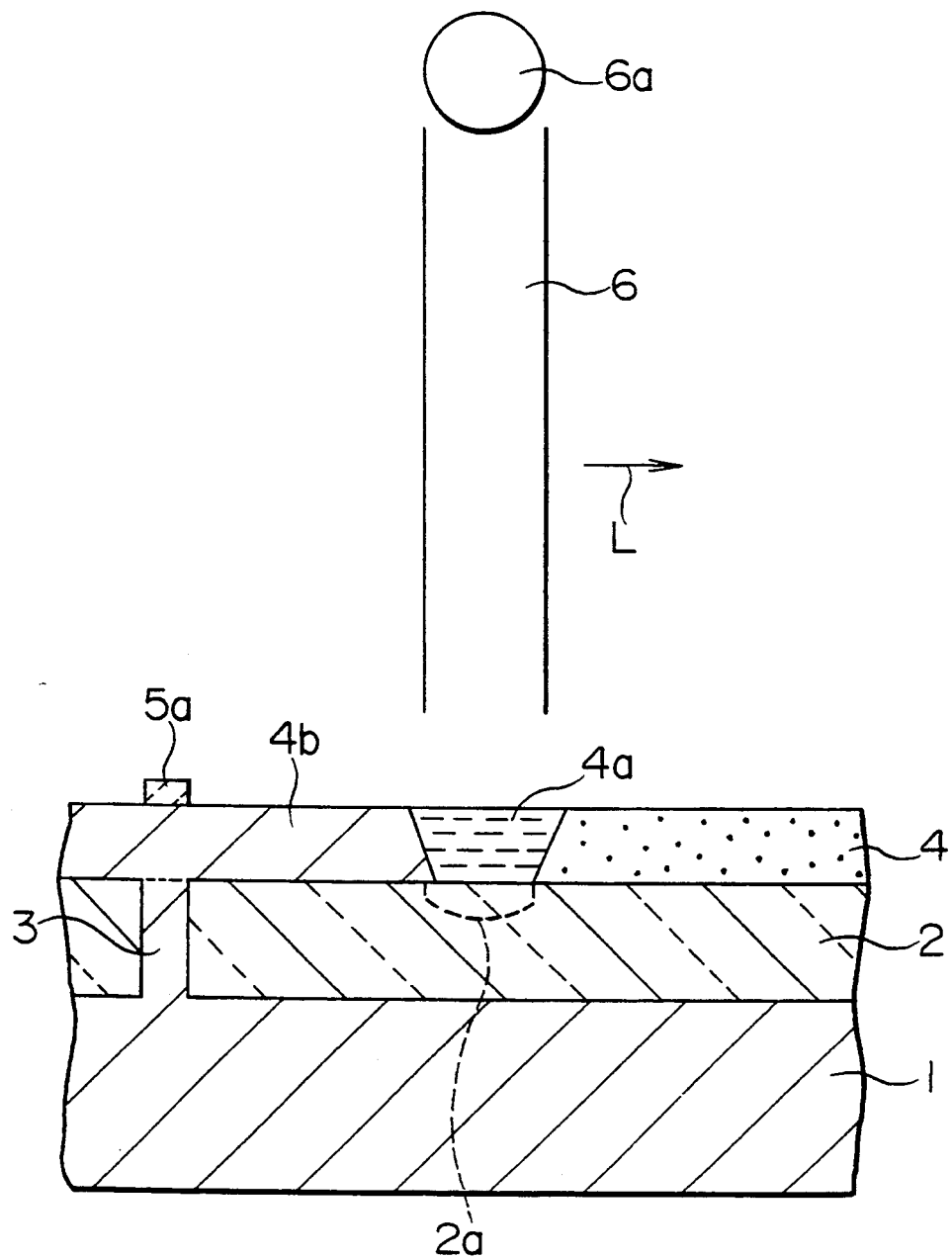
FIG. 7 is a view which illustrates a conventional method of forming single-crystal semiconductor films.
Figure 8:
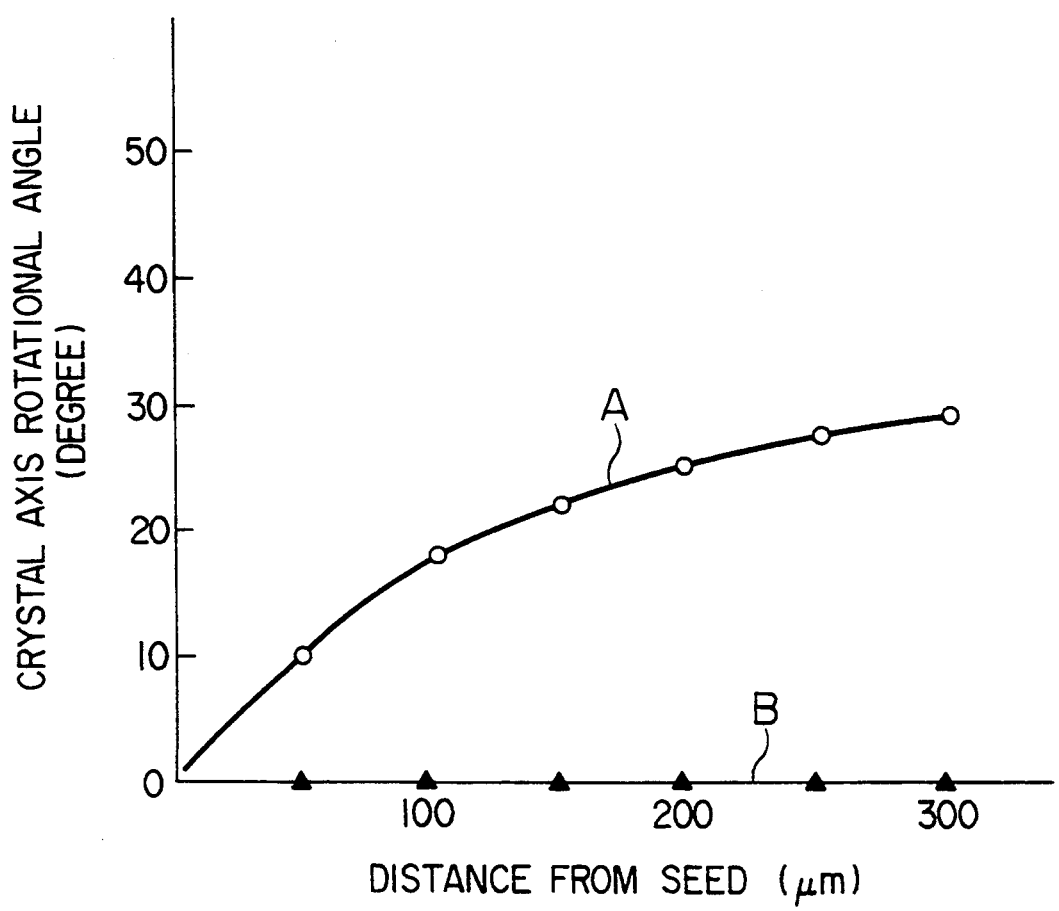
FIG. 8 is a view which illustrates the rotations of the crystal axes of the single-crystal films formed according to the method of the present invention and according to the conventional method.
Figure 9:
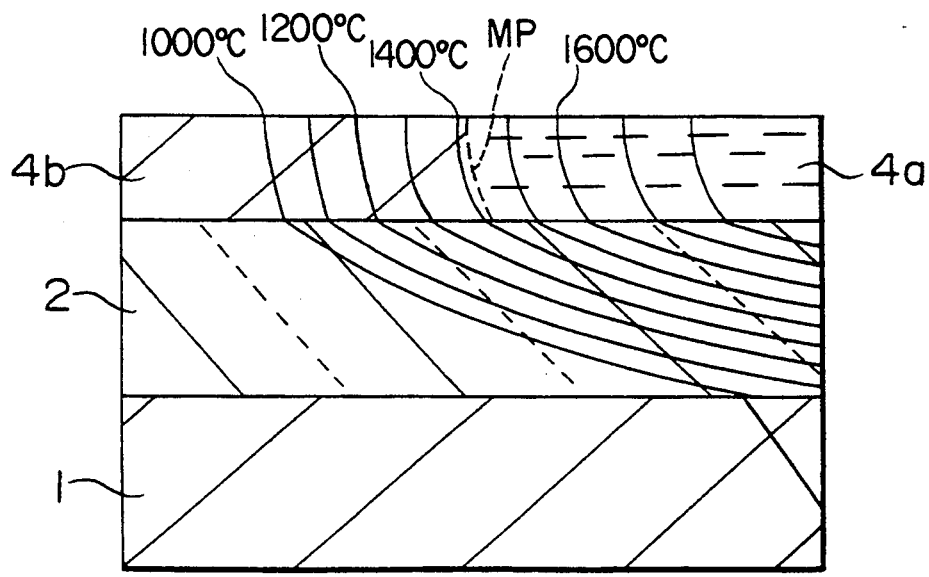
FIG. 9 is a cross-sectional view which illustrates the temperature distribution in the vicinity of an extreme end at which the single-crystal film is grown.

It can be seen from the results of the simulation in FIG. 9 that in the prior art in FIG. 7, the portion 2a where the oxide film 2 is softened is extended backward approximately 3 μm from the extreme end where the single-crystal film 4b is grown. However, in such a degree of expansion of the softened portion 2a, the crystal rotation of the single-crystal film 4b could not be reduced. This can be thought as that, since the expansion of the softened portion 2a from the extreme end where the single-crystal film 4b is grown to the backward portion is not much different from the thickness of the single-crystal film 4b, which is 0.5 μm, the softened portion 2a cannot be moved enough to sufficiently discharge the elastic strain energy within the single-crystal film 4b.

From the results of the above-described study, the softened portion 2b of the oxide film 2 is effective when it is extended from the extreme end 4d where a single-crystal film 4c is grown to the backward portion, a distance 10 times or more than that of the thickness of the single-crystal silicon film 4c. It is desirable that, for example, the softened portion 2b be extended 30 μm from the extreme end 4d of the growth to the backward portion with respect to the single-crystal film 4c, shown in FIG. 1, having a thickness of 0.5 μm.

Figure 2:
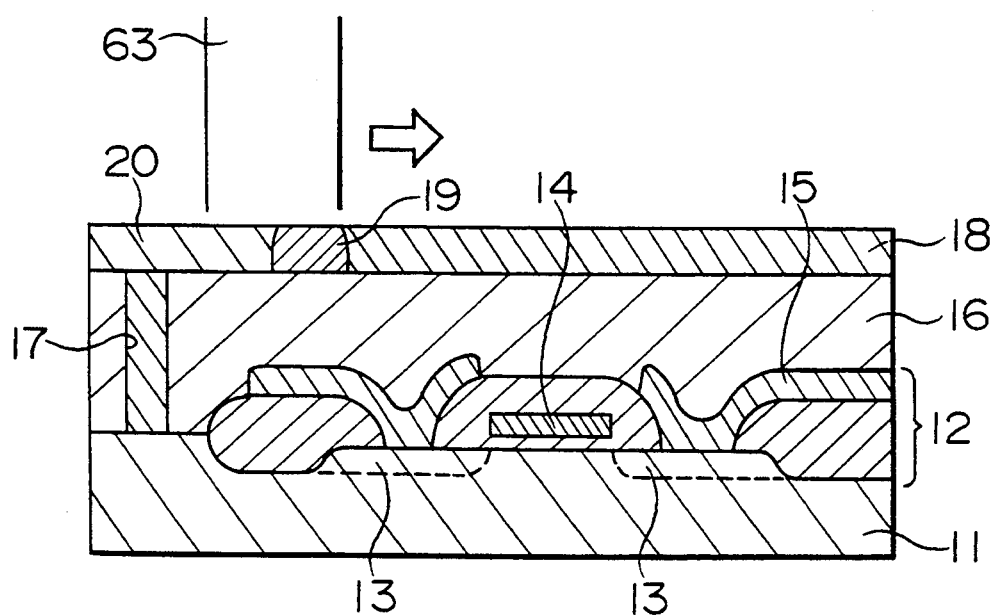
FIGS. 2 to 4 are each cross-sectional views which illustrate phases in which a laminated semiconductor device is manufactured by using a single-crystal film which is formed by the present invention.
Figure 3:
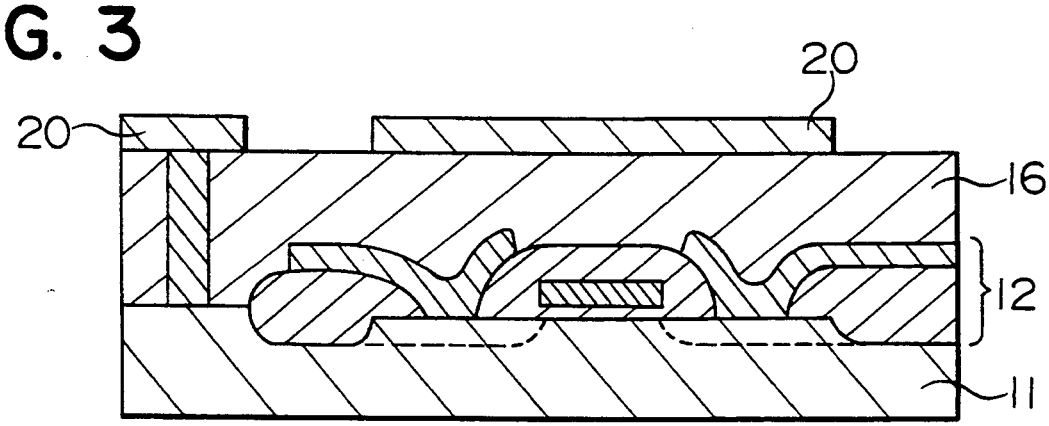
Figure 4:
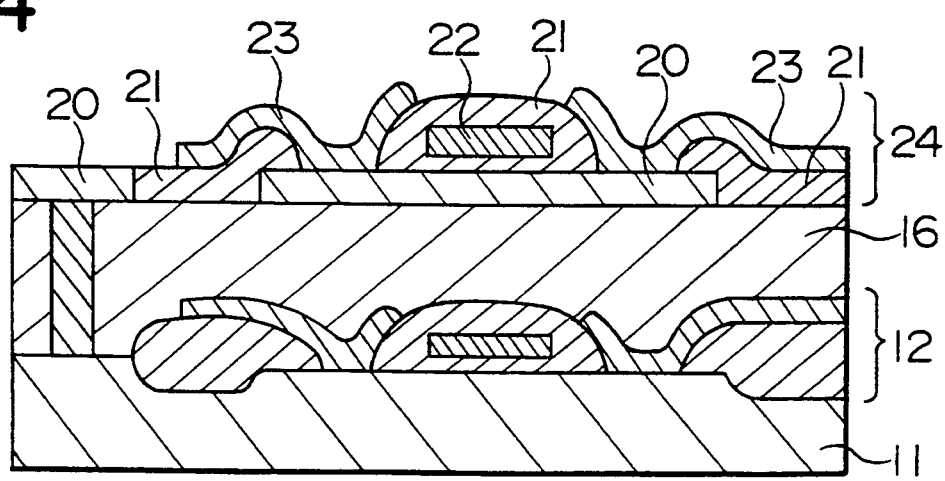

The circumstances where a two-layer semiconductor device is manufactured by using the method of the present invention is shown in FIGS. 2 to 4. In FIG. 2, a MOS transistor 12 of the first layer is formed on a P-type silicon single-crystal substrate 11. The transistor 12 comprises an N-type impurity implantation area 13 formed in the upper layer portion of the substrate 11, a gate electrode 14, a tungsten silicide layer 15 or the like. A CVD oxide film 16 serving as an interlayer insulation film is formed on the substrate 11 in such a manner as to cover this transistor 12. A seed hole 17 which goes through the oxide film 16 is provided, and a polycrystalline silicon film 18 is deposited on the oxide film 16.

The compound laser beam 63 shown in FIG. 1 is irradiated on the surface of the polycrystalline silicon film 18, starting from the seed hole 17. The polycrystalline silicon film 18 is melted by scanning the laser beam in the direction shown by the arrow. As a result of the melted silicon 19 being solidified again, a single-crystal silicon film 20 is formed.

Next, the single-crystal silicon film 20 formed on the oxide film 16 in this manner is patterned as shown in FIG. 3. Thereafter, as shown in FIG. 4, an oxide film 21, a gate electrode 22, a tungsten silicide layer 23 or the like are formed on the single-crystal silicon film 20, forming a transistor 24 of the second layer.

According to the present invention, since a high-quality single-crystal film 20 whose crystal axis is scarcely rotated is formed on the insulation film 16, semiconductor devices of a multilayer structure having excellent characteristics can be manufactured as described above.

Although in the above-described embodiment in FIG. 1, the softened portion 2b was formed in the upper layer portion of the oxide film 2 by using the second laser beam 62, an electron beam or an infrared beam or other energy beam having a diameter which is condensed into not greater than approximately 500 μm may also be used.

Although the two energy beams 61 and 62 in the embodiment in FIG. 1 each have a circular cross section, a laser beam having a cross section in a shape other than a circle, for example, an elliptical cross section may also be used.

In addition, although in the embodiment in FIG. 1 the temperature of the substrate 1 was set at 450° C., the temperature is not limited to this temperature, but can be set at any temperatures of not greater than approximately 800° C. When the substrate temperature is not greater than approximately 800° C., impurities in impurity portions of a circuit element which has already been formed in a semiconductor substrate can be prevented from being diffused to other portions. However, the power density of the first and second laser beams 61 and 62 must be adjusted according to the set temperature of the substrate.

Also, if an amorphous silicon is deposited on the single-crystal substrate 1 in place of the polycrystalline silicon film 4 and this is irradiated with the compound laser beam 63, likewise a single-crystal silicon form can be obtained.

What is claimed is:

1. A method of forming single-crystal semiconductor films, in which a single-crystal semiconductor film having crystal axes transferred from a single-crystal semiconductor substrate are formed on an insulator layer via a seed hole which goes through the insulator layer which is formed on the single-crystal semiconductor substrate, said method comprising the steps of:

forming a non-single-crystal semiconductor substrate connected to a single-crystal semiconductor substrate via a seed hole formed in said insulator layer positioned below the non-single-crystal semiconductor film;

irradiating a compound beam comprising a first energy beam having a power density which is capable of melting a non-single-crystal semiconductor film and a second energy beam having a power density which is not capable of melting the non-single-crystal semiconductor film but is capable of softening said insulator layer; and epitaxially growing the single-crystal semiconductor film in such a way that the non-single-crystal semiconductor film is melted and then solidified again by scanning the surface of the non-single-crystal semiconductor film with the compound beam, starting from the seed hole, in such a manner that the first energy beam is irradiated first and the second energy beam is irradiated second.

2. A method according to claim 1 wherein the first energy beam is a laser beam.

3. A method according to claim 1 wherein the second energy beam is a laser beam.

4. A method according to claim 1 wherein the second energy beam is an electron beam, the diameter of which is condensed into not greater than 500 $\mu$m.

5. A method according to claim 1 wherein the second energy beam is an infrared beam, the diameter of which is condensed into not greater than 500 $\mu$m.

6. A method according to claim 1 wherein a part of the first energy beam and that of the second energy beam are combined with each other to form a compound beam.

7. A method according to claim 1 wherein the single-crystal semiconductor substrate is maintained at a temperature of not greater than 800° C.

8. A method according to claim 1 wherein an upper layer portion of the insulator layer is maintained at a temperature above the softened point thereof over a distance 10 times the thickness of the single-crystal semiconductor film from the extreme end where the single-crystal semiconductor film is grown to the backward portion.

* * * * *